United States Patent
Hanada et al.

(10) Patent No.: US 10,042,016 B2
(45) Date of Patent: Aug. 7, 2018

(54) MAGNETIC RESONANCE IMAGING APPARATUS, AND CONTROL APPARATUS OF CRYOGENIC COOLING SYSTEM AND CONTROL METHOD THEREOF

(71) Applicant: HITACHI, LTD., Tokyo (JP)

(72) Inventors: Hikaru Hanada, Tokyo (JP); Takuya Fujikawa, Tokyo (JP); Akihiro Shimada, Tokyo (JP); Kenji Sakakibara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 57 days.

(21) Appl. No.: 15/440,642

(22) Filed: Feb. 23, 2017

(65) Prior Publication Data
US 2018/0188341 A1     Jul. 5, 2018

(30) Foreign Application Priority Data
Jan. 4, 2017   (JP) .................................. 2017-000195

(51) Int. Cl.
    *F25B 9/00*      (2006.01)
    *G01R 33/38*     (2006.01)
    (Continued)

(52) U.S. Cl.
    CPC ............ *G01R 33/3804* (2013.01); *F25B 9/00* (2013.01); *F25B 25/005* (2013.01);
    (Continued)

(58) Field of Classification Search
    CPC ........ F25B 49/022; F25B 9/00; F25B 25/005; F25B 2500/07; F25B 2500/06; F25B 2600/01; G01R 33/3804; F25G 49/022
    See application file for complete search history.

(56) References Cited

U.S. PATENT DOCUMENTS

| | | | |
|---|---|---|---|
| 6,041,608 A * | 3/2000 | Fujiwara | F25B 9/00 62/229 |
| 2009/0082657 A1* | 3/2009 | Dalchau | F25D 29/001 600/410 |

(Continued)

FOREIGN PATENT DOCUMENTS

| | | |
|---|---|---|
| JP | H11-99135 | 4/1999 |
| JP | 2011-5091 | 1/2011 |
| JP | 2015-54217 | 3/2015 |

OTHER PUBLICATIONS

Mar. 28, 2017 Decision to Grant a Patent (and English translation thereof) in connection with corresponding Japanese patent application No. 2017-000195.

*Primary Examiner* — Brian King
(74) *Attorney, Agent, or Firm* — Cooper & Dunham LLP

(57) ABSTRACT

There is provided an MRI apparatus including a superconducting magnet that includes a refrigerant container and a superconducting coil, a cryogenic cooling system with which the superconducting magnet is provided, and a controller that controls the operation of the cryogenic cooling system. The cryogenic cooling system includes a cold head, a cryo-cooler, a compressor that supplies a compressed gas to the cryo-cooler, and a detection unit that detects the pressure in the refrigerant container, the refrigerant container being provided with the cold head, the cryo-cooler, the compressor, and the detection unit. An upper limit value of the maximum number of times of halts of the compressor within a predetermined period of time is set in advance. The controller intermittently halts the compressor within a range in which the pressure detected by the detection unit is equal to or lower than a predetermined upper limit value and performs control such that the number of times of halts of the compressor within the predetermined period of time (Continued)

reaches the upper limit value of the maximum number of times of halts.

8 Claims, 6 Drawing Sheets

(51) Int. Cl.
    *F25B 49/02*     (2006.01)
    *F25B 25/00*     (2006.01)
    *G01R 33/3815*     (2006.01)

(52) U.S. Cl.
    CPC ........ F25B 49/022 (2013.01); G01R 33/3815 (2013.01); *F25B 2500/06* (2013.01); *F25B 2500/07* (2013.01); *F25B 2600/01* (2013.01); *F25B 2600/0251* (2013.01)

(56) References Cited

U.S. PATENT DOCUMENTS

| | | | |
|---|---|---|---|
| 2009/0210199 A1* | 8/2009 | Tsuda | G01R 33/3804 702/188 |
| 2013/0047632 A1* | 2/2013 | Rillo Millan | F25B 9/00 62/6 |
| 2013/0160468 A1* | 6/2013 | Kimura | F25B 49/022 62/6 |

* cited by examiner

MAGNETIC RESONANCE IMAGING APPARATUS, AND CONTROL APPARATUS OF CRYOGENIC COOLING SYSTEM AND CONTROL METHOD THEREOF

BACKGROUND OF THE INVENTION

Field of the Invention

The invention relates to a magnetic resonance imaging (hereinafter, referred to as MRI) apparatus that measures a nuclear magnetic resonance signal (hereinafter, referred to as an NMR signal) from hydrogen, phosphorus or the like in an object to visualize a nuclear density distribution or a relaxation time distribution and the invention particularly relates to a technique of controlling a cryogenic cooling system in an MRI apparatus which includes a superconducting magnet.

Background Art

The MRI apparatus is an apparatus that measures an NMR signal generated by nuclear spins constituting a structure of an object, particularly a human body, and that visualizes the morphologies and functions of a head, an abdomen, four limbs, or the like of the object two-dimensionally or three-dimensionally. Since a correlation between the SN ratio of the NMR signal and the magnetic field strength of the MRI apparatus is positive, the superconducting magnet, with which a high magnetic field strength can be achieved, is used in the MRI apparatus.

The superconducting magnet is disposed in a helium container in which liquid helium is injected and is cooled to the boiling point of the liquid helium (4.2 K) so that the superconductive state of a coil, which generates a magnetic field, is maintained. Since the liquid helium evaporates and disappears, the superconducting magnet is provided with a cryogenic cooling system and has a configuration in which gasified helium is condensed and captured on a surface having a very low temperature and returns to the liquid helium. The cryogenic cooling system is configured to include a cold head that is attached to the helium container and condenses gasified helium, a cryo-cooler that cools the cold head, and a compressor that drives the cryo-cooler.

Usually, recondensation of the gasified helium is performed at all times. In addition, in a case where the pressure in the helium container excessively decreases due to the recondensation of the gasified helium, pressure control, in which a heater disposed in the helium container is caused to generate minute heat so as to gasify the helium, is performed.

As described above, the cryogenic cooling system is driven and consumes power even at a time when the MRI apparatus is not used. Therefore, for example, JP-A-11-99135 proposes a technique of suppressing power consumption in the cryogenic cooling system. In the technique of JP-A-11-99135, a timer is connected to the compressor and the compressor is halted at late night or early morning so that the cryogenic cooling system is halted. Meanwhile, JP-A-2015-54217 proposes a technique in which the cryogenic cooling system is halted during inspection using the MRI apparatus in order to prevent deterioration in image quality which is attributable to vibration of the cryo-cooler.

SUMMARY OF THE INVENTION

However, in the technique of JP-A-11-99135, the compressor and the cryogenic cooling system are continuously halted for a long period of time at late night or early morning. Accordingly, the temperature of the cold head rises and the cold head swells. Therefore, the cold head is worn when the operation of the compressor is restarted and thus there is a problem that the life span of the cold head becomes short. In addition, since the compressor is halted for a long period of time, the temperature of the helium container also rises and there is a high possibility of helium loss attributable to boil-off.

In the technique of JP-A-2015-54217, the operation of the cryogenic cooling system is controlled using a provided temperature threshold value. However, control for minimizing a change in temperature is not performed and wear of the cold head is not considered.

Meanwhile, since a load is applied to a motor when the compressor is restarted, there is a restriction on the number of times of halts of the compressor which is designated by a manufacturer. Specifically, the number of times of halts is restricted to 24 times per day and 6 times per hour, for example.

In consideration of the above-described problem, an object of the present invention is to maintain a long life span of a cold head by minimizing a change in temperature of the cold head and to reduce the amount of consumed power by shortening the operation time of a compressor with a restriction on the number of times of halts of the compressor.

In order to solve the above-described problem, the invention provides an MRI apparatus including a superconducting magnet that includes a refrigerant container and a superconducting coil, a cryogenic cooling system with which the superconducting magnet is provided, and a controller that controls the operation of the cryogenic cooling system. The cryogenic cooling system includes a cold head, a cryo-cooler, a compressor that supplies a compressed gas to the cryo-cooler, and a detection unit that detects the pressure in the refrigerant container, the refrigerant container being provided with the cold head, the cryo-cooler, the compressor, and the detection unit. An upper limit value of the maximum number of times of halts of the compressor within a predetermined period of time is set in advance. The controller intermittently halts the compressor within a range in which the pressure detected by the detection unit is equal to or lower than a predetermined upper limit value and performs control such that the number of times of halts of the compressor within the predetermined period of time reaches the upper limit value of the maximum number of times of halts.

According to the invention, it is possible to maintain a long life span of a cold head by minimizing a change in temperature of the cold head and to reduce the amount of consumed power by shortening the operation time of a compressor while satisfying a condition relating to a restriction on the number of times of halts of a compressor.

DETAILED DESCRIPTION OF THE INVENTION

Hereinafter, embodiments of the invention will be described.

First Embodiment

Figure 1:
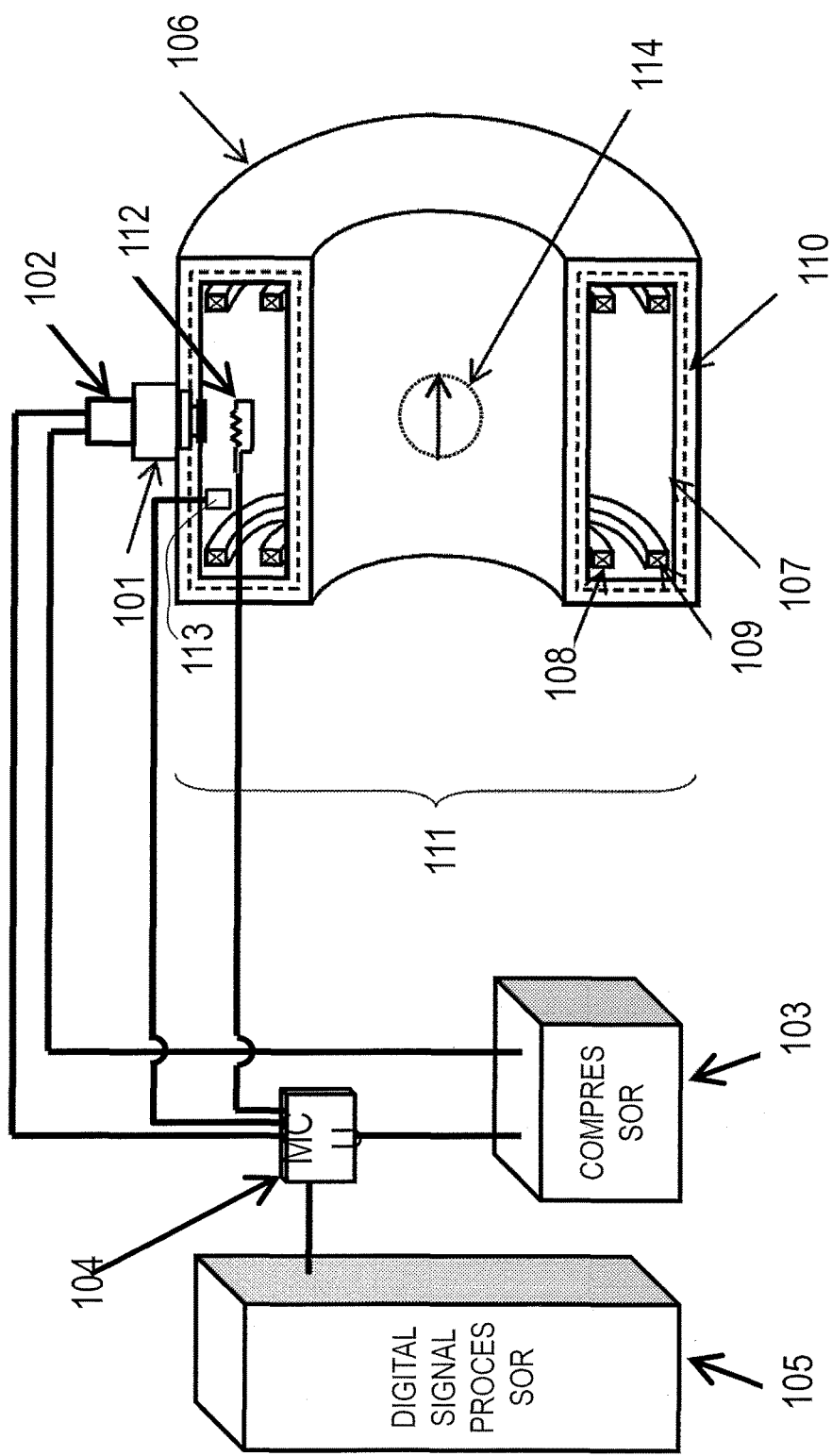
FIG. 1 is a block diagram illustrating configurations of a superconducting magnet and a cryogenic cooling system in an MRI apparatus according to a first embodiment.

As illustrated in FIG. 1, an MRI apparatus according to a first embodiment includes a superconducting magnet 111, a cryogenic cooling system that maintains the pressure and the temperature in the superconducting magnet 111, and a digital signal processing device (a controller) 105 that controls the operation of the cryogenic cooling system.

The superconducting magnet 111 includes a main coil 108 that generates a magnetic field, a shield coil 109 that prevents a stray magnetic field from being generated, a refrigerant (helium) container 107 that accommodates the coils 108 and 109 and cools the coils 108 and 109 to the boiling point of a refrigerant (for example, 4.2 K), a 40K shield 110 for preventing radiant heat, and a vacuum container 106 that accommodates all of these components.

The cryogenic cooling system is configured to include a cold head 101, a cryo-cooler 102, a compressor 103, a heater 112, a detection unit 113, and a magnet monitoring unit 104. The cold head 101 and the cryo-cooler 102 constitute a cryogenic cooling pump and an opening which is provided in the helium container 107 and the vacuum container 106 is provided with the cold head 101 and the cryo-cooler 102. The compressor 103 supplies a compressed refrigerant gas to the cryo-cooler 102 and drives a movable unit in the cold head 101 to cool the cold head 101 to a temperature equal to or lower than the boiling point of a refrigerant. The magnet monitoring unit 104 has three functions. The first one of the functions is a function of measuring the pressure in the helium container 107 and the temperature of a wall surface of the helium container 107 from an output signal of the detection unit 113. The second one of the functions is a function of controlling the operation and the halt of the compressor 103. The third one of the functions is a function of operating the heater 112 in the helium container 107 to rise the temperature so that the pressure in the helium container 107 slightly rises in a case where the pressure in the helium container 107 is excessively low and is equal to or lower than a predetermined pressure.

The digital signal processing device 105 obtains the pressure and the temperature in the helium container 107 via the magnet monitoring unit 104. In addition, the digital signal processing device 105 operates and halts the compressor 103 via the magnet monitoring unit 104 on the basis of information on the pressure and the temperature in the helium container 107.

Accordingly, the superconducting magnet 111 generates a uniform static magnetic field in an imaging space 114. In addition, the MRI apparatus includes a gradient magnetic field coil that applies a gradient magnetic field to the imaging space 114, a transmission coil that irradiates an object disposed in the imaging space 114 with a high frequency pulse, a reception coil that receives an NMR signal generated by the object, and an image reconstruction unit that reconstructs an image by processing the signal received by the reception coil, in addition to the superconducting magnet 111. The digital signal processing device 105 also can be used as the image reconstruction unit.

The digital signal processing device 105 is constituted by a processor such as a CPU and a memory and it is possible to realize at least a function of controlling the cryogenic cooling system with the processor executing a program, which is stored in the memory in advance. In addition, it is possible to realize a portion or all of functions of the digital signal processing device 105 by using a hardware such as an application specific integrated circuit (ASIC) or a field-programmable gate array (FPGA).

An operation in which the digital signal processing device 105 controls the cryogenic cooling system will be described below with reference to FIG. 2. In the following description, "pressure" and "temperature" mean the pressure and the temperature in the helium container 107.

Figure 3A:
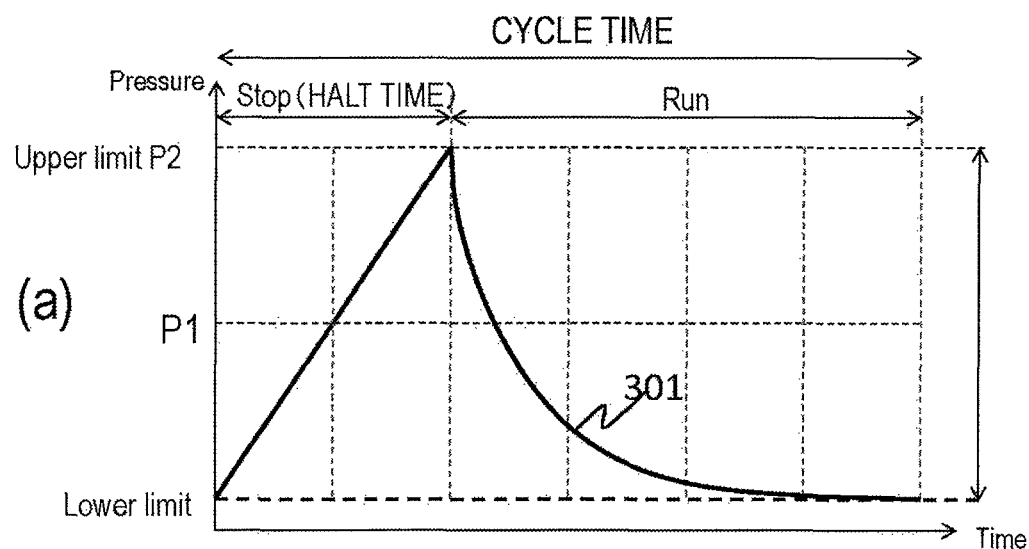
FIGS. 3A and 3B are graphs illustrating how the pressure in a helium container according to the first embodiment changes over time.

In the first embodiment, the digital signal processing device 105 intermittently halts the compressor 103 within a range in which the pressure detected by the detection unit 113 is equal to or lower than a predetermined upper limit value and performs control such that the number of times of halts of the compressor 103 within the predetermined period of time reaches the upper limit value of the maximum number of times of halts of the compressor 103. For example, as illustrated in FIG. 3A, the digital signal processing device 105 operates the compressor 103 in a case where an elapsed time after the compressor 103 is halted reaches a predetermined "halt time" or the pressure detected by the detection unit 113 reaches a predetermined upper limit pressure value (Upper limit) and the digital signal processing device 105 halts the compressor 103 again in a case where the pressure reaches a predetermined lower limit pressure value (Lower limit) and a predetermined "cycle time" has elapsed after a previous halt. Whenever the cycle time elapses, the digital signal processing device 105 calculates the cycle time and the halt time to halt the compressor 103 a number of times equal to the number of remaining times of halts within the remainder of the predetermined period of time and resets the cycle time and the halt time. Hereinafter, this will be described in detail below.

Figure 2:
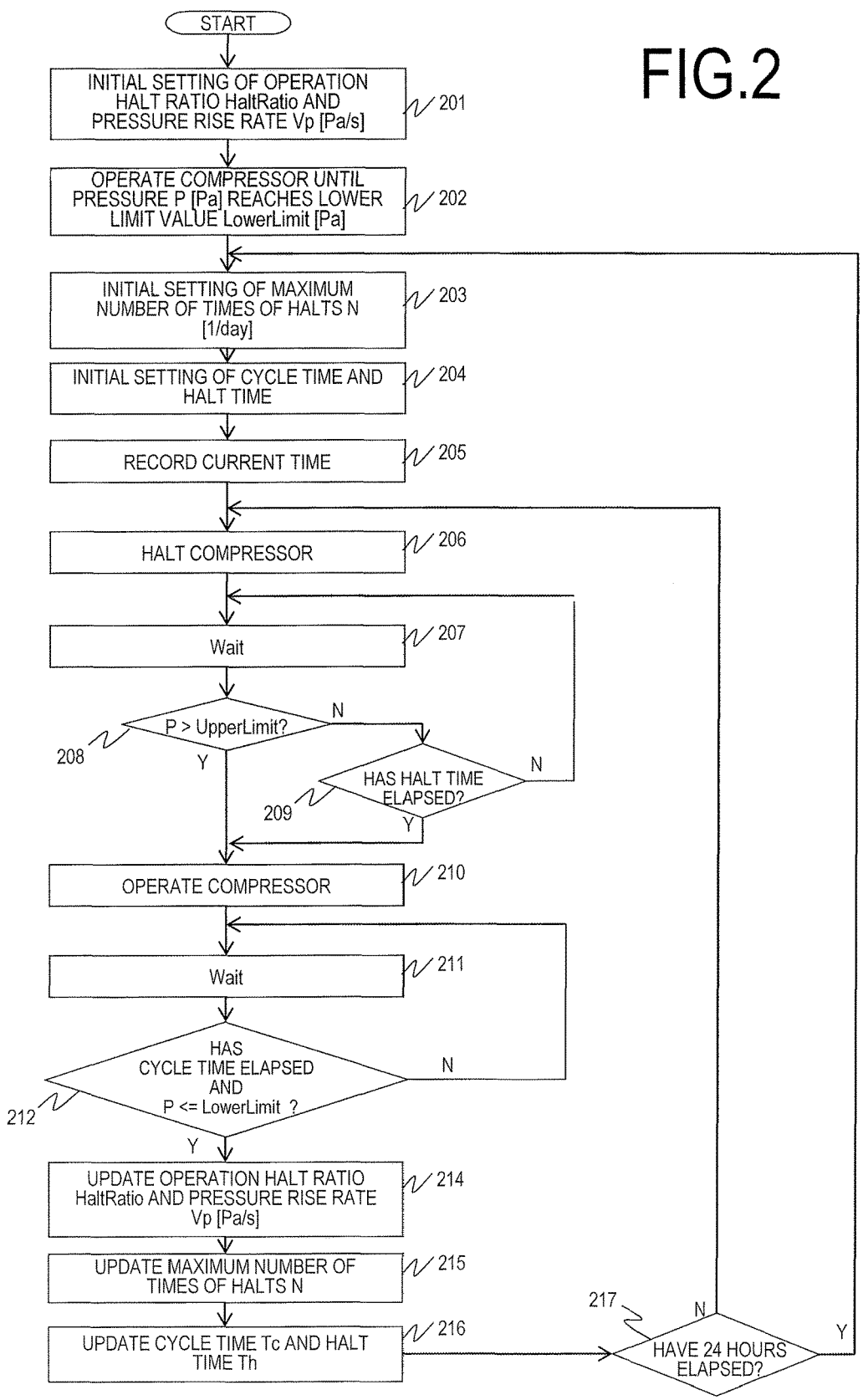
FIG. 2 is a flowchart illustrating an operation of a digital signal processing device according to the first embodiment.

First, in Process 201 in FIG. 2, the digital signal processing device 105 sets an operation halt ratio HaltRatio [unitless] and a pressure rise rate Vp [Pa/s].

The operation halt ratio HaltRatio is a ratio of the halt time of the compressor 103 to a time between a previous halt of the compressor and a current halt of the compressor (the cycle time). As the "cycle time" with which an initial value of the operation halt ratio set in Process 201 is determined, a time required to return the pressure, which has risen due to a halt of the compressor 103 for the halt time, to the pressure before the halt of the compressor is used. The operation halt ratio HaltRatio is influenced by the atmospheric pressure, external heat input, radiant heat attributable to a gradient magnetic field of the MRI apparatus, and the performance of the compressor 103 and the cryo-cooler. However, here, the operation halt ratio HaltRatio is set to a predetermined value while not considering individual differences between magnets and the environment. For example, the initial value of the operation halt ratio HaltRatio is a value of ⅓ or the like. This means that a time required to return the pressure to the pressure before the halt of the compressor (the cycle time) is approximately two times the halt time of the compressor.

The pressure rise rate Vp [Pa/s] is a rate at which the temperature rises for the halt time of the compressor 103. This parameter is influenced by external heat input and radiant heat attributable to a gradient magnetic field of the MRI apparatus. However, here, the pressure rise rate is set to a predetermined value. The pressure rise rate is set to a value of 0.38 [Pa/s] or the like on the basis of experiences of the inventors.

In Process 202, the digital signal processing device 105 operates the compressor until the pressure P [Pa] reaches a predetermined lower limit pressure value LowerLimit [Pa].

When the pressure reaches the lower limit pressure value, in Process 203, the digital signal processing device 105 sets the maximum number of times of halts N [1/day] of the compressor 103. As an upper limit value of the maximum number of times of halts N [1/day] within a predetermined period of time (for example, one day) (hereinafter, referred to as the maximum number of times of halts), a value designated by a manufacturer of the compressor 103 is used. In the first embodiment, a unit time for controlling the cryogenic cooling system is set to 24 hours (one day) and thus a unit of the maximum number of times of halts N is [1/day]. The maximum number of times of halts N is a value of 24 [1/day] or the like.

In Process 204, the digital signal processing device 105 calculates initial values of the cycle time Tc [s] and the halt time Th [s] using the operation halt ratio HaltRatio and the maximum number of times of halts N according to following Equations (1) and (2), respectively.

$$Tc=(24\times60\times60)/N \quad (1)$$

$$Th=Tc\times \text{HaltRatio} \quad (2)$$

According to Equation (1), the initial value of the cycle time Tc [s] is set to a value which is obtained by equally dividing 24 hours by the maximum number of times of halts N of the compressor [1/day]. According to Equation (2), the initial value of the halt time Th [s] is set to the halt time of the compressor 103 within the cycle time Tc. Hereinabove, processes before the first halt of the compressor have been described.

Subsequently, a current time is recorded in Process 205 and the digital signal processing device 105 causes the compressor 103 to enter a halted state in Process 206.

In Process 207, the digital signal processing device 105 waits for an arbitrary time (for example, 60 seconds). The waiting time may be changed depending on the state of the MRI apparatus. For example, the waiting time during an imaging operation which is performed by the MRI apparatus may be set to be short (for example, 10 seconds) since it is expected that there is a large change in pressure during the imaging operation.

In Branch 208, the digital signal processing device 105 determines whether the current pressure P detected by the detection unit 113 has reached the predetermined upper limit pressure value UpperLimit. In a case where the pressure P is greater than UpperLimit, the digital signal processing device 105 proceeds to Process 210 and operates the compressor 103. On the other hand, in a case where the pressure P is equal to or lower than UpperLimit, the digital signal processing device 105 proceeds to Branch 209. Here, the upper limit pressure value UpperLimit is a predicted value of the maximum pressure within the cycle time and is calculated according to following Equation (3) by using the pressure rise rate Vp of which the initial value is set in Process 201 and the halt time Th obtained in Process 204.

$$\text{UpperLimit}=Vp\times Th \quad (3)$$

As described above, the digital signal processing device 105 operates the compressor 103 in a case where the pressure P has reached the upper limit pressure value Upper-Limit so that a sharp change in pressure, which is attributable to application of the gradient magnetic field or the like, can be prevented.

Meanwhile, in Branch 209, the digital signal processing device 105 confirms whether the halt time Th which is set in Process 204 has elapsed or not. In a case where an elapsed time after the halt of the compressor 103 is shorter than the halt time Th, the digital signal processing device 105 returns to Process 207 again and waits for another predetermined time. In a case where an elapsed time after the halt of the compressor 103 is equal to or longer than the halt time Th, the digital signal processing device 105 proceeds to Process 210 and the digital signal processing device 105 switches the state of the compressor to an operated state in Process 210.

In Process 211, the digital signal processing device 105 waits until the waiting time elapses as with Process 207 and proceeds to Branch 212 thereafter.

In Branch 212, the digital signal processing device 105 proceeds to Process 214 in a case where the sum of the halt time of the compressor and the operation time of the compressor is longer than the cycle time Tc and the pressure P has reached the lower limit pressure value LowerLimit. Otherwise, the digital signal processing device 105 returns to Process 211. In addition, in Branch 212, when the pressure P reaches the lower limit pressure value Lower-Limit for the first time after the compressor is operated, a time between the start of the operation of the compressor and the current time is recorded as CooldownTime.

In Process 214, the digital signal processing device 105 recalculates the operation halt ratio HaltRatio and the pressure rise rate Vp [Pa/s] according to following Equations (4) and (5) by using the actual net halt time HaltedTime [s] of the compressor 103 in the current cycle time Tc and the maximum pressure MaxPressure [Pa] and updates operation halt ratio HaltRatio and the pressure rise rate Vp [Pa/s].

$$\text{HaltRatio}=\text{HaltedTime}/(\text{HaltedTime}+\text{CooldownTime}) \quad (4)$$

$$Vp=\text{MaxPressure}/\text{HaltedTime} \quad (5)$$

Next, in Process 215, the digital signal processing device 105 calculates the maximum number of times of halts N of the compressor 103 within the remainder of the predetermined period of time (24 hours) according to Equation (6) and updates the maximum number of times of halts N. That is, the maximum number of times of halts N updated according to Equation (6) indicates how many times the compressor 103 is halted within the remainder of the predetermined period of time (24 hours).

$$N=N-1 \quad (6)$$

In Process 216, the digital signal processing device 105 recalculates the cycle time Tc [s] and the halt time Th [s] according to Equations (7) and (8) by using the updated operation halt ratio HaltRatio and the updated maximum number of times of halts N.

$$Tc=(24\times60\times60-\text{ElapsedTime})/N \quad (7)$$

$$Th=Tc\times\text{HaltRatio} \quad (8)$$

Here, ElapsedTime [s] is the elapsed time [s] from a time of a previous halt of the compressor which is recorded in Process 205. The right-hand side of Equation (7) represents a time which is obtained by equally dividing a period of time, which is obtained by subtracting ElapsedTime [s] from the predetermined period of time (24 hours), by the maximum number of times of halts N updated in Process 215.

Then, in Branch 217, in a case where the elapsed time after the time recorded in Process 205 is not longer than the predetermined period of time (24 hours), the digital signal processing device 105 returns to Process 206 and executes the next cycle. In a case where the elapsed time is longer than the predetermined period of time (24 hours), the digital signal processing device 105 returns to Process 203 and starts an operation for a new predetermined period of time.

Figure 3B:
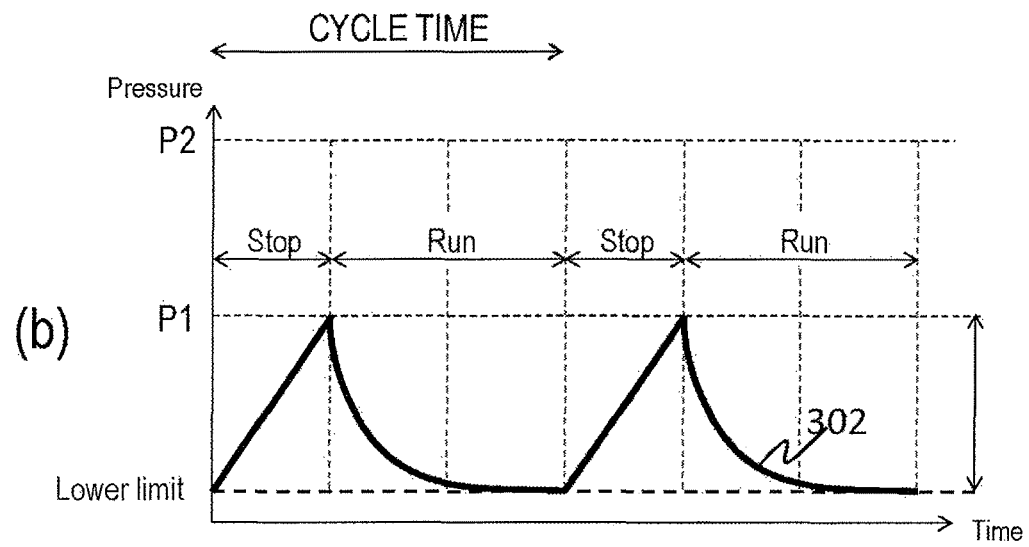

FIGS. 3A and 3B illustrate a change in pressure in the helium container 107. A graph 301 in FIG. 3A illustrates a change in pressure pertaining to a case where the cycle time Tc is long and the halt time of the compressor 103 is long and a graph 302 in FIG. 3B illustrates a change in pressure pertaining to a case where the cycle time Tc is short and the halt time of the compressor 103 is short. The cycle time of the graph 302 is short in comparison with the graph 301 and thus the change in pressure is small. Accordingly, a change in temperature of the cold head is also small in comparison with a case of the graph 301. When a control process of the cryogenic cooling system which has been described with reference to the flowchart in FIG. 2 is performed, since the compressor 103 is halted a number of times equal to the upper limit value of the maximum number of times of halts within the predetermined period of time, it is possible to shorten the cycle time as much as possible and the change in pressure becomes small as illustrated by the graph 302. Therefore, it is possible to reduce the amount of consumed power by halting the operation while preventing the life span of the cold head from being shortened due to the operation being halted.

As described above, in the related art, a restriction on the number of times of halts of the compressor is not considered. However, in the first embodiment, the halt time and the operation time of the compressor 103 are determined such that the compressor 103 is halted a number of times equal to the upper limit of the maximum number of times of halts with the restriction on the number of times of halts of the compressor. Therefore, according to the first embodiment, it is possible to shorten the continuous halt time of the compressor 103 while suppressing the amount of consumed power and thus a change in temperature of the cold head 101 is minimized and wear of the cold head 101 is suppressed. In addition, according to the first embodiment, since the cycle time is short and each halt time of the compressor 103 is also short, a pressure rise magnitude is small and a possibility of boil-off can be lowered.

Second Embodiment

In a second embodiment, the cryogenic cooling system is controlled such that the compressor is continuously operated in a typical time period in which the MRI apparatus is used and a certain level of pressure rise is allowed for the other time periods.

Specifically, in the second embodiment, the digital signal processing device 105 sets a continuous operation time, which is set in advance, in the predetermined period of time. In addition, the digital signal processing device 105 calculates the cycle time and the halt time to halt the compressor 103 a number of times equal to the number of remaining times of halts within the remainder of the predetermined period of time which is obtained by subtracting the continuous operation time from the predetermined period of time and resets the cycle time and the halt time. At this time, the digital signal processing device 105 allows that the lower limit pressure value is reset to be higher than a previous value whenever the cycle time elapses. The other configurations of the second embodiment are the same as those in the first embodiment.

Figure 4:
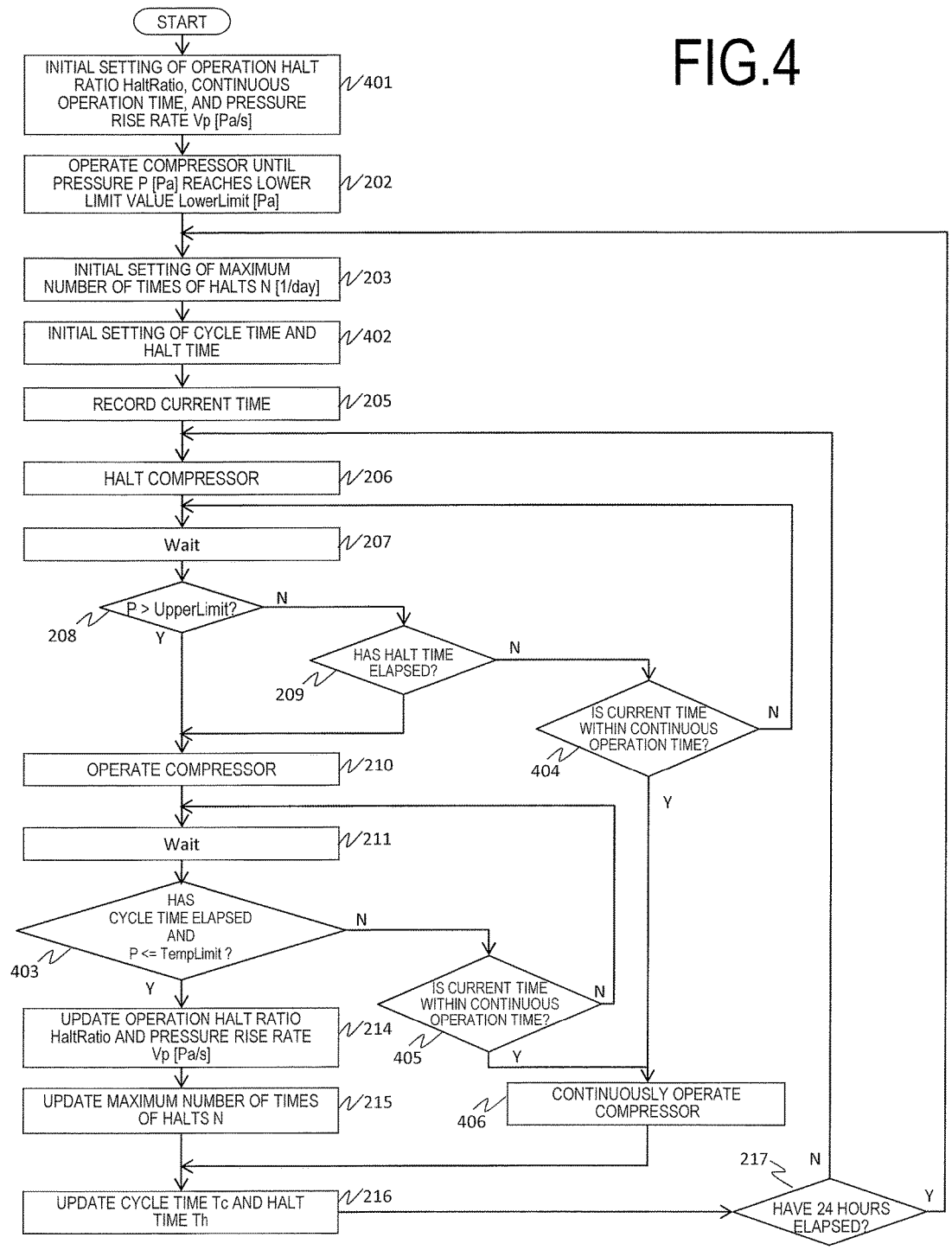
FIG. 4 is a flowchart illustrating an operation of a digital signal processing device according to a second embodiment.

A flow of a process in the digital signal processing device 105 of the second embodiment will be described in detail with reference to FIG. 4. Processes in FIG. 4 which are the same as the processes in FIG. 2 of the first embodiment are given the same reference numerals.

Figure 5:
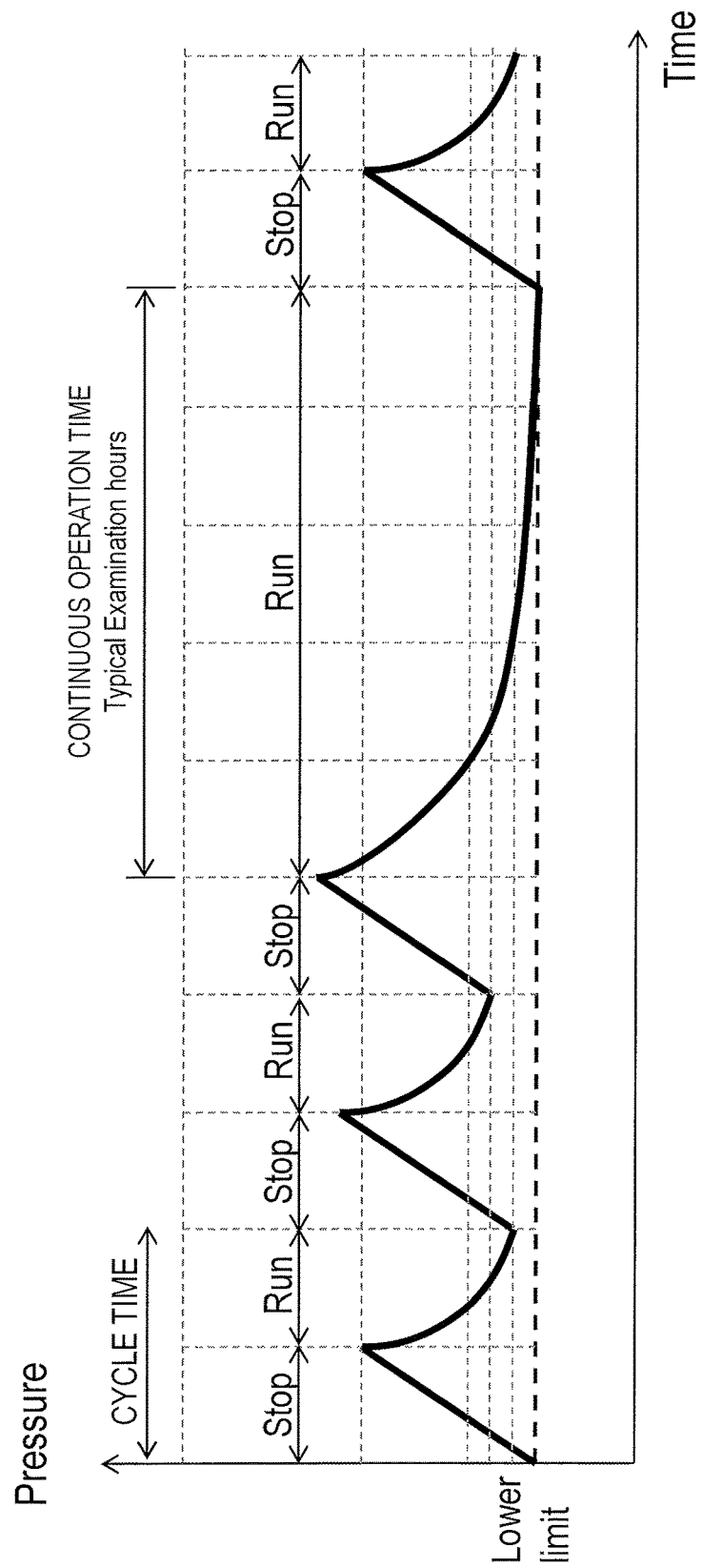
FIG. 5 is a graph illustrating how the pressure in a helium container according to the second embodiment changes over time.

Hereinafter, processes in FIG. 4 will be described while focusing on a difference from the first embodiment. First, in Process 401, the digital signal processing device 105 sets the continuous operation time in addition to the operation halt ratio HaltRatio [unitless] and the pressure rise rate Vp [Pa/s] as illustrated in FIG. 5. The continuous operation time indicates a time period in which the compressor is continuously operated and the continuous operation time is preferably set to a time period in one day in which inspection using the MRI apparatus is performed. For example, the continuous operation time is designated to 9:00 to 17:00. Since the helium container 107 can be sufficiently cooled within the continuous operation time, in the second embodiment, the compressor 103 is intermittently halted a number of times equal to the upper limit number of the maximum number of times of halts in time periods other than the continuous operation time. Therefore, in the time periods other than the continuous operation time, the pressure at the end of the cycle time is allowed to be higher than the pressure at the start of the cycle time (that is, the end of the previous cycle time). In addition, the operation halt ratio HaltRatio is also set to be higher than that in the first embodiment in consideration of the continuous operation time. Specifically, the operation halt ratio HaltRatio is set according to following Equation (9).

$$HaltRatio = \frac{24 \times OriginalHaltRatio}{24 - ContinuousRunning} \quad (9)$$

Here, OriginalHaltRatio is the operation halt ratio required to return the pressure to the original pressure within the cycle as with HaltRatio in Process 201 of the first embodiment. In addition, ContinuousRunning is the continuous operation time and is 8 [h] in a case where the continuous operation time is 9:00 to 17:00 as described above.

Processes 202 and 203 are performed in the same manner as in the first embodiment. In Process 402, the same calculation method as in Process 204 of the first embodiment is used except that HaltRatio obtained according to Equation (9) is used. In addition, in Process 209, in a case where the halt time has elapsed, the digital signal processing device 105 proceeds to Branch 404 and the digital signal processing device 105 determines whether the current time is within the continuous operation time (9:00 to 17:00). In a case where the current time is within the continuous operation time, the digital signal processing device 105 proceeds to Process 406. In Process 406, the digital signal processing device 105 operates the compressor 103 for a predetermined time. Process 406 is terminated under a condition that the continuous operation time of the compressor has elapsed and the pressure is equal to or lower than above-described LowerLimit.

On the other hand, when the current time is not within the continuous operation time, the digital signal processing device 105 proceeds to Branch 403 after Process 211 and determines whether or not the cycle time has elapsed and the pressure is equal to or lower than TempLimit. Here, TempLimit is defined according to following Equation (10).

$$\text{TempLimit} = \text{InitialPressure} + \text{RiseRatio} \times t \quad (10)$$

Here, InitialPressure is the pressure at the start of the cycle. That is, InitialPressure is the pressure right before the compressor 103 is halted in Process 206. In addition, RiseRatio is the predetermined allowed pressure rise rate per unit time. For example, if a rise in pressure of 50 [Pa] per hour is allowed, RiseRatio is approximately 0.0139 [Pa/s]. Furthermore, t in Equation (10) is the elapsed time [s] in the cycle. In a case where the pressure is decreased to a pressure which is higher than the pressure at the start of the cycle by RiseRatio×t and which is calculated according to Equation (10) and the cycle time has elapsed, the digital signal processing device 105 returns to Process 206 after the operation halt ratio or the like is updated in Processes 214 to 216, halts the compressor 103, and proceeds to the next cycle.

In Process 403, in a case where the cycle time has not elapsed or the pressure is not equal to or lower than TempLimit, the digital signal processing device 105 proceeds to Branch 405. In Branch 405, in a case where the current time is within the continuous operation time, the digital signal processing device 105 proceeds to Process 406 and operates the compressor for a predetermined time.

FIG. 5 illustrates a change in pressure pertaining to a case where the second embodiment is applied. The pressure is decreased to LowerLimit in the continuous operation time while the pressure rises each time the cycle is repeated in time periods other than the continuous operation time. In addition, in time periods other than the continuous operation time, the operation is halted a number of times equal to the upper limit value of the maximum number of times of halts of the compressor 103.

As described above, in the second embodiment, even in a case where a time in which the compressor is continuously operated is provided, the operation is halted a number of times equal to the upper limit value of the maximum number of times of halts of the compressor 103. Therefore, it is possible to reduce the amount of consumed power while suppressing a change in pressure. In addition, it is possible to reduce a possibility of boil-off which is caused by a sharp change in pressure during use of the MRI apparatus since the time in which the compressor is continuously operated is provided. In addition, since a certain level of rise in pressure during a non-continuous operation time is allowed in consideration of a fact that the helium container is sufficiently cooled in the continuous operation time so that the pressure is decreased, it is possible to lengthen the halt time of the compressor.

Third Embodiment

In a third embodiment, the compressor 103 is halted for each halt time as with the first embodiment and the compressor is continuously operated after an accumulation of halt times reaches a predetermined time. The other configurations are the same as those in the first embodiment.

Figure 6:
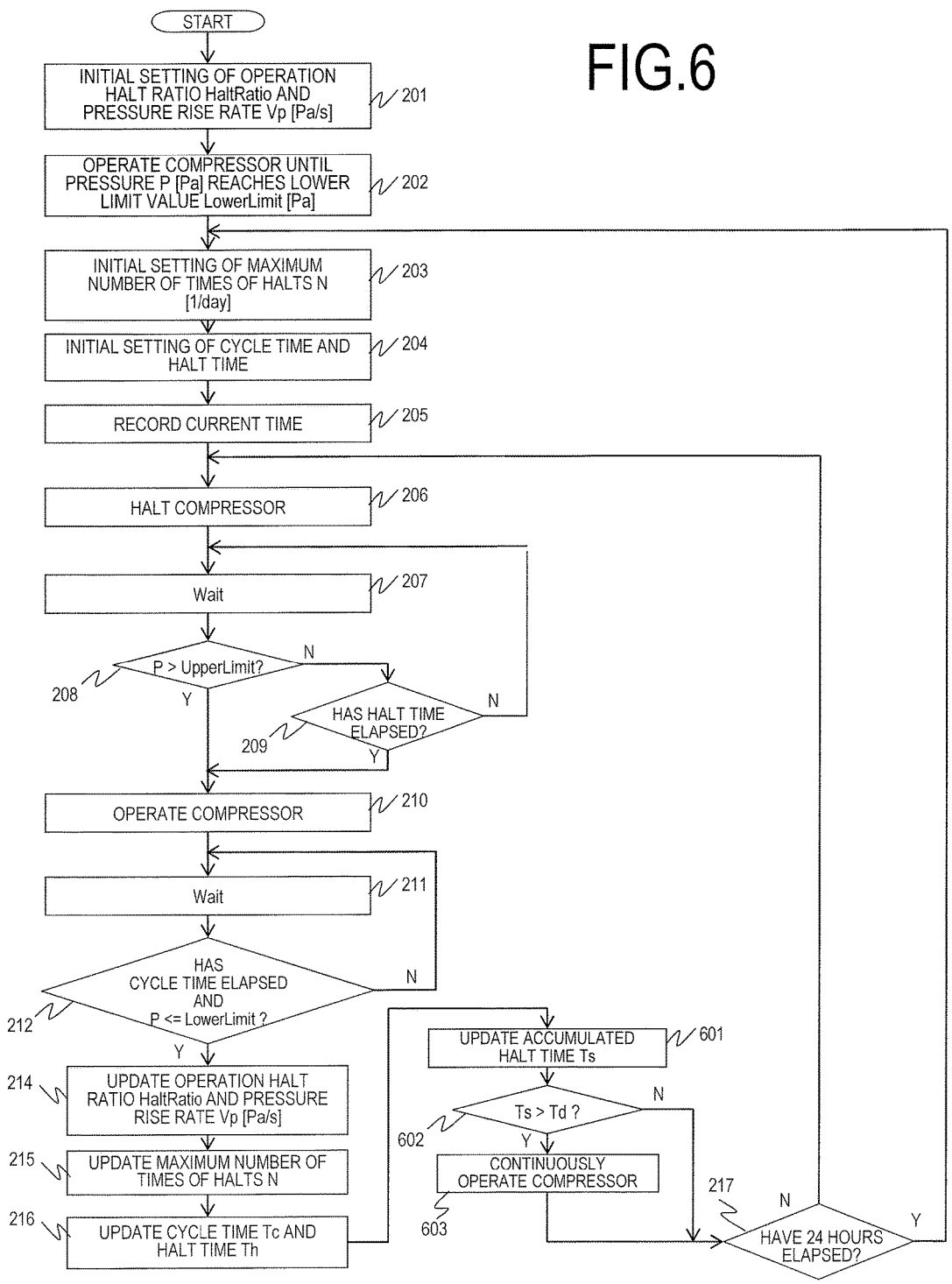
FIG. 6 is a flowchart illustrating an operation of a digital signal processing device according to a third embodiment.

A flow of a process in the third embodiment is illustrated in FIG. 6. Processes in FIG. 6 which are the same as those in the first embodiment are given the same reference numerals. Hereinafter, processes which are different from those in the first embodiment will be described. First, the digital signal processing device 105 proceeds to Process 601 and calculates an accumulated halt time Ts so far after Processes 201 to 216 are performed in the same manner as in the first embodiment. The accumulated halt time Ts is the total time in which the compressor 103 is halted within the predetermined period of time (24 hours). In Branch 602 which is subsequent to Process 601, the digital signal processing device 105 compares the accumulated halt time Ts with a regulation halt time Td and continuously operates the compressor 103 for the remainder of the predetermined period of time in a case where the accumulated halt time Ts is longer than the regulation halt time Td. That is, a time in which the compressor is continuously operated is 24 hours after the time recorded in Process 205.

The regulation halt time Td is an upper limit value of a time in which the compressor is halted within 24 hours and is determined in advance on the basis of a decrease in amount of consumed power caused by a halt of the compressor. For example, in a case where the compressor consumes power of 5 kW, the regulation halt time Td is set to 4 [h] in a case where it is desired that the compressor consumes power of 20 kWh per day.

In a case where the accumulated halt time Ts is not longer than the regulation halt time Td in Process 602 or after the compressor 103 is continuously operated in Process 603, the digital signal processing device 105 proceeds to Branch 217. The other processes are performed in the same manner as in the first embodiment.

As described above, in the third embodiment, the regulation halt time Td is defined and the compressor is continuously operated without being halted in a case where the halt time of the compressor is longer than Td. Accordingly, it is possible to minimize wear of the compressor and the cold head while minimizing the number of times of changes in temperature accompanying a halt of the compressor.

Note that, the invention is not limited to the above-described embodiments. In the above-described embodiments, timing of a halt of the compressor is determined on the basis of the pressure in the helium container. However, the determination may be performed on the basis of the temperature in the helium container. In addition, in the above-described embodiments, an example in which a unit time for controlling the cryogenic cooling system is set to 24 hours has been described. However, the unit time may not be 24 hours. In addition, the determination in Branch 208 may be changed to determination on whether or not an imaging operation of the MRI apparatus is started or determination on whether or not there is a change in pressure which is greater than the cooling capacity of the cryogenic cooling system. Furthermore, in the second embodiment, a time period in which the MRI apparatus is operated is set. In addition to this, the MRI apparatus may be set not to be operated at weekends or a holiday.

What is claimed is:
1. A magnetic resonance imaging apparatus comprising:
   a superconducting magnet that includes a refrigerant container and a superconducting coil;
   a cryogenic cooling system with which the superconducting magnet is provided; and
   a controller that controls the operation of the cryogenic cooling system,
   wherein the cryogenic cooling system includes a cold head with which the refrigerant container is provided, a cryo-cooler, a compressor that supplies a compressed gas to the cryo-cooler, and a detection unit that detects the pressure in the refrigerant container,
   wherein an upper limit value of the maximum number of times of halts of the compressor within a predetermined period of time is set in advance, and wherein the controller intermittently halts the compressor within a range in which the pressure detected by the detection unit is equal to or lower than a predetermined upper limit value and performs control such that the number of times of halts of the compressor within the predetermined period of time reaches the upper limit value of the maximum number of times of halts.

2. The magnetic resonance imaging apparatus according to claim 1,
wherein the controller operates the compressor in a case where the pressure detected by the detection unit reaches a predetermined upper limit pressure value after the compressor is halted or an elapsed time after the compressor is halted reaches a predetermined halt time and the controller halts the compressor in a case where the pressure reaches a predetermined lower limit pressure value and a predetermined cycle time has elapsed after a previous halt.

3. The magnetic resonance imaging apparatus according to claim 2,
wherein, whenever the cycle time elapses, the controller calculates the cycle time and the halt time to halt the compressor a number of times equal to the number of remaining times of halts within the remainder of the predetermined period of time and resets the cycle time and the halt time.

4. The magnetic resonance imaging apparatus according to claim 3,
wherein the controller sets a predetermined continuous operation time within the predetermined period of time and the controller calculates the cycle time and the halt time to halt the compressor a number of times equal to the number of remaining times of halts within the remainder of the predetermined period of time, which is obtained by subtracting the continuous operation time from the predetermined period of time, and resets the cycle time and the halt time.

5. The magnetic resonance imaging apparatus according to claim 4,
wherein the controller resets the lower limit pressure value to be higher than a previous value whenever the cycle time elapses.

6. The magnetic resonance imaging apparatus according to claim 2,
wherein, in a case where an accumulation of the halt times of the compressor for each cycle time reaches a predetermined time, the controller continuously operates the compressor thereafter.

7. A control apparatus of a cryogenic cooling system which includes a cold head, a cryo-cooler, and a compressor supplying a compressed gas to the cryo-cooler and which cools the interior of a refrigerant container with which a superconducting magnet is provided,
wherein an upper limit value of the maximum number of times of halts of the compressor within a predetermined period of time is set in advance, and
wherein the control apparatus intermittently halts the compressor within a range in which the pressure in the refrigerant container is equal to or lower than a predetermined upper limit value and performs control such that the number of times of halts of the compressor within the predetermined period of time reaches the upper limit value of the maximum number of times of halts.

8. A control method of a cryogenic cooling system which includes a cold head, a cryo-cooler, and a compressor supplying a compressed gas to the cryo-cooler for cooling the interior of a refrigerant container and in which an upper limit value of the maximum number of times of halts of the compressor within a predetermined period of time is set in advance, the method comprising:
intermittently halting the compressor such that the number of times of halts within the predetermined period of time reaches the upper limit value of the maximum number of times of halts and the pressure in a refrigerant container is equal to or lower than a predetermined upper limit value.

* * * * *